United States Patent [19]

Baumann

[11] Patent Number: 5,355,129
[45] Date of Patent: Oct. 11, 1994

[54] MEASURING SENSOR DEVICE

[75] Inventor: Bernd Baumann, Weissach, Fed. Rep. of Germany

[73] Assignee: Dr. Ing. h.c.F. Porsche AG, Fed. Rep. of Germany

[21] Appl. No.: 966,185

[22] PCT Filed: Jul. 10, 1991

[86] PCT No.: PCT/EP91/01288

§ 371 Date: Mar. 24, 1993

§ 102(e) Date: Mar. 24, 1993

[87] PCT Pub. No.: WO92/02783

PCT Pub. Date: Feb. 20, 1992

[30] Foreign Application Priority Data

Aug. 1, 1990 [DE] Fed. Rep. of Germany ....... 4024402

[51] Int. Cl.$^5$ ............................................. G01D 18/00
[52] U.S. Cl. ........................... 340/870.04; 340/870.01; 340/870.19; 324/601
[58] Field of Search ................ 340/870.01, 870.02, 340/870.04, 870.11, 870.13, 870.14, 870.19; 324/601

[56] References Cited

U.S. PATENT DOCUMENTS

| | | | |
|---|---|---|---|
| 3,439,258 | 4/1969 | Van Leeuwen | 324/601 |
| 4,081,744 | 3/1978 | Ray . | |
| 4,298,969 | 11/1981 | Rickenbacker | 324/601 |
| 4,621,228 | 11/1986 | Toki | 324/601 |
| 4,872,007 | 10/1989 | Monterosso | 340/870.01 |
| 4,881,071 | 11/1989 | Monterosso | 340/870.01 |

FOREIGN PATENT DOCUMENTS

| | | |
|---|---|---|
| 0324067 | 7/1989 | European Pat. Off. . |
| 0406627 | 2/1991 | European Pat. Off. . |
| 3116690 | 11/1982 | Fed. Rep. of Germany . |
| 3318977 | 11/1984 | Fed. Rep. of Germany . |
| 3446248 | 6/1986 | Fed. Rep. of Germany . |
| 3632840 | 1/1989 | Fed. Rep. of Germany . |
| 3743846 | 6/1992 | Fed. Rep. of Germany . |
| 2218213 | 11/1989 | United Kingdom . |

Primary Examiner—Kenneth A. Wieder
Assistant Examiner—Jose M. Solis

[57] ABSTRACT

A measuring sensor device for the detection of physical quantities is equipped with an identification generator in whose memory module correction data (sensor identification data) are stored. For the transmission of identification data, the identification generator is connected, via two of the lines which are normally used for the measured value transmission and/or the energy supply of the measuring sensor device and another line used for a shunt calibration of the measuring sensor device, to the analysis circuit and can be activated and controlled by the latter. By means of a special wiring of the identification generator, correction data may also be fed into it during a calibration. The thus obtained system for the detection of physical quantities is therefore distinguished by high flexibility, simplicity with respect to circuits and operatability in extreme temperatures.

24 Claims, 6 Drawing Sheets

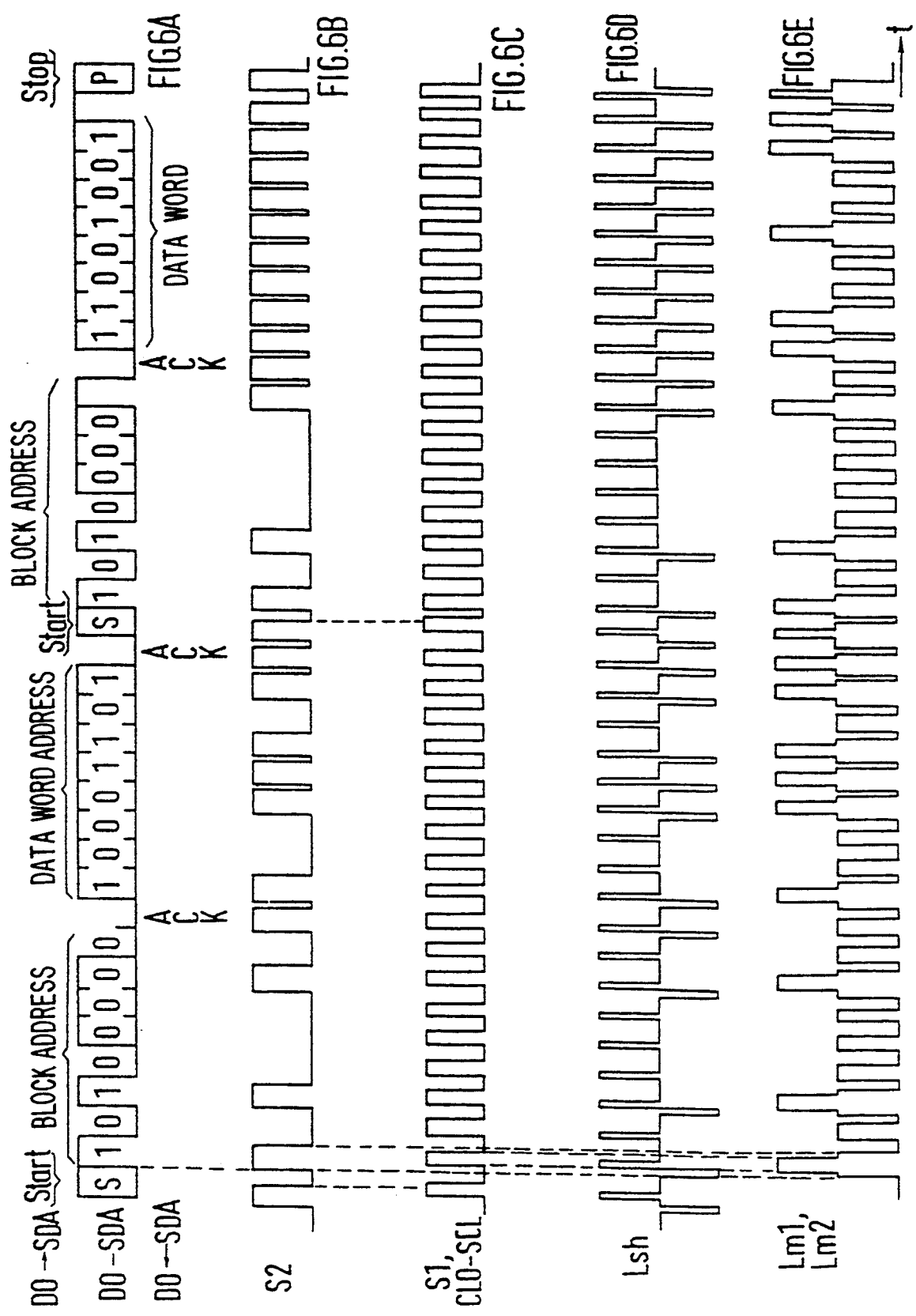

MEASURING SENSOR DEVICE

BACKGROUND AND SUMMARY OF THE INVENTION

A measuring sensor device 1 for detecting a physical quantity which, via a physical electrical transducer 2, is converted into an equivalent analog electrical quantity and, by means of an analysis circuit 5 connected behind it, which constructionally is not combined with the measuring sensor device 1, is connected to this measuring sensor device 1 by way of electrical lines (Lm1, Lm2, +Us, −Us) used for the transmission of measured values and/or for the energy supply of the measuring sensor device, is converted into quantities, preferably digital data which can be processed further (measuring operation), the physical-electrical transducer 2 being connected in a bridge circuit (measuring bridge 3), and individual branches of the measuring bridge 3, for calibration purposes, being capable of being detuned in a defined manner by the parallel connecting of a shunt resistor (Rs) arranged on the measuring sensor device 1, by way of switches (shunt switches S1, S2) assigned to the analysis circuit 5 and a shunt line Lsh connecting the switches with the shunt resistor (shunt calibration, calibrating operation), and an identification generator 8 being integrated in the measuring sensor device 1 which comprises a nonvolatile memory module 9, 18 with correction data (sensor identification data) of the measuring sensor device 1, as well as a controllable switching element (sh+, sh−) situated in parallel to a branch (R2, R4; R1, R3) of the measuring bridge 3, for the defined detuning of the measuring bridge 13 in the controlled condition, the identification generator 8, in the case of an activatable transmission of the correction data to the analysis circuit 5, switching the controllable switching element (Sh+, Sh−) on and off in the rhythm of the data bit flow read out serially from the memory module 9, 18, and the analysis circuit 5 or a computer connected behind it detecting the analog signals or their changes at the measuring bridge 3 and regenerating the correction data from them which may be used for the correction of the electrical quantities furnished by the physical-electrical transducer 2 (identifying operation), characterized in that, from the identification generator, at least one auxiliary shunt resistor (Rsh+, Rsh−), by way of electrically controllable auxiliary shunt switches (Sh+, Sh−), can be connected in parallel to at least one of the switches (S1, S2) and the shunt resistor (Rs), and in that the identification generator 8 has a circuit 20 which responds to defined pulses or a defined pulse sequence on the shunt line (Lsh) and controls the identification generator 8, and the identification generator 8 can be switched over in its operating mode (measuring operation, calibrating operation) by the superimposing of such pulses or pulse sequences on the shunt line (Lsh) by means of the shunt switches (S1, S2), in the operating mode.
- —measuring operation and calibrating operation, the identification generator 8 being switched in such a manner that the measuring sensing is largely unaffected by the identification generator 8,
- —calibrating operation, the physical-electrical transducer 2 can be detuned in a defined manner by the shunt switches (S1, S2; Sh+, Sh−) and the shunt resistor (Rs; Rsh+, Rsh−),
- —identifying operation, by controlling the auxiliary shunt switches (Sh+, Sh−) by means of the controlling circuit 20, the correction data can be transmitted via the measuring lines (Lm1, Lm2) from the identification generator 8 to the analysis circuit.

In measuring devices or measuring data detecting and processing systems, it is frequently necessary to place the measuring sensor device with the actual physical-electrical transducer, which detects a physical quantity to be detected and converts it into an electric signal which is equivalent to it, physically away from an analysis circuit for the signal (or measured value) editing and processing. The measuring sensor device and the analysis circuit are then as a rule connected with one another by way of electric lines, the lines, in turn, being connected with the analysis circuit of a plug connection.

The separation of the measuring sensor device and the analysis circuit is frequently for reasons related to space (in order to be able to construct the measuring sensor device as small as possible). However, it is often the result of a "rough" environment in which the measuring device is to be operated. These are frequently extremely high or low temperatures, dirt, humidity, high electromagnetic radiation, etc., which are conditions under which the measuring sensor devices can operate more or less perfectly, but in which the operatability of an analysis device with sensitive electronic components does not exist.

German Patent Document DE-34 46 248 A1 shows a measuring sensor device is known with a physical-electrical transducer which constructionally is not combined with an analysis circuit. The measuring sensor device comprises a memory module with correction data for the measured values detected by the physical-electrical transducer. The physical-electrical transducer and the memory module are connected by way of at least one output with the analysis circuit which can read the correction data out of the memory module and correspondingly correct the measured values supplied by the transducer.

However, this known measuring sensor device and the process for its alignment show only a principle for the method of operation of such a measuring system but supply no information with respect to a technical implementation in practice. In addition, a programming of the memory module with the correction values requires a connecting of a plurality of lines (bus connection) which, when the sensor is completed, are no longer accessible from the outside so that an "aged" measuring sensor device (that is, a measuring sensor device which no longer furnishes correct data) can no longer be recalibrated. The measuring sensor must therefore be replaced.

Likewise, German Patent Document DE-33 18 977 A1 discloses a measuring sensor device with an information carrier (memory module) which contains operating data. Data of the memory module are either read out at the start of the operation via several connecting lines which are separated from the measuring lines and are transmitted to a remotely arranged microcomputer, or the whole memory module is removed and inserted into a processing part which operates away from the sensor.

Thus, either additional lines are required from the sensor to the processing part, or a manual operation is required which, on the one hand, is cumbersome and, on the other hand, may frequently result in damage to the sensitive connecting contact pins of the memory module.

A device for the measuring of physical quantities comprising a digital memory is shown in German Patent Document DE 31 16 690 A1. This digital memory can be loaded with calibration data for the device. However, for the readin/readout of data from this digital memory, special electric connecting lines must be provided which connect the device with an analysis device in addition to the measuring and power supply lines.

German Patent Document DE-37 43 846 A1 comprises a measuring sensor device with a memory module which is a component of an identification generator integrated in the measuring sensor device. For the initialization of the readout process, the identification generator is acted upon via only one other line with a timing signal which is used at the same time for the timing synchronization and the power supply of the identification generator. During the readout process, the data are fed, by means of the coupling of the identification generator, to the lines which are normally used for the measured-value transmission, to an analysis circuit with analog inputs and are regenerated there from the signals present on the lines or from their changes.

Furthermore, measuring sensor devices with physical-electrical transducers are known in the case of which, for the purpose of calibration, by way of a shunt switch, a shunt resistor can be connected in parallel with respect to bridge branches (shunt calibration).

An object of the invention is to integrate into a measuring sensor device with a shunt calibration an identification generator so that, with as few expenditures as possible with respect to additional components or lines, a controlled readout of data from a memory of the identification generator becomes possible as well as their transmission to an analysis circuit.

Some of the principal advantages of the invention are that a measuring sensor device with a correction data memory module is provided from which the correction data can be read out by simple devices when the operation of the measuring sensor device is started because, for this readout process, largely existing lines are used which are normally used for the measured-value transmission or the power supply or a shunt calibration of the sensor.

The circuit (identification generator) to be arranged for this purpose in the measuring sensor device is distinguished by a small number of switching elements and negligibly affects the measured-value detection in the measuring operation. The identification generator is also distinguished by a high operating temperature range. Furthermore, in the case of a calibration or recalibration, data can be written in via the existing lines from the analysis circuit into the memory module of the measuring sensor device.

Another advantage provided by the identification generator, of the present invention is the possibility of filing operational data of the measuring sensor device, such as the supply voltage and the site of application, in the memory module and reading them out because the identification generator can be operated completely independently of the actual sensor (physical-electrical transducer).

By means of counting pulses superimposed on the shunt line and by means of a circuit which counts them in the identification generator, the identification generator of the present invention can be switched with respect to its mode of operation (measuring operation, calibrating operation, identifying operation), and the initialization and the control of the data transmission can be influenced so that the data output can be adapted to the most varied analysis circuits or a starting address for the readout of the data from the memory module can be changed.

BRIEF DESCRIPTION OF THE DRAWINGS

FIGS. 6a-6e are signal-time diagrams for a memory module of the identification generator, for actuating of shunt switches, and for data signals on a shunt line and measuring signal lines.

DETAILED DESCRIPTION OF THE INVENTION

Figure 1:
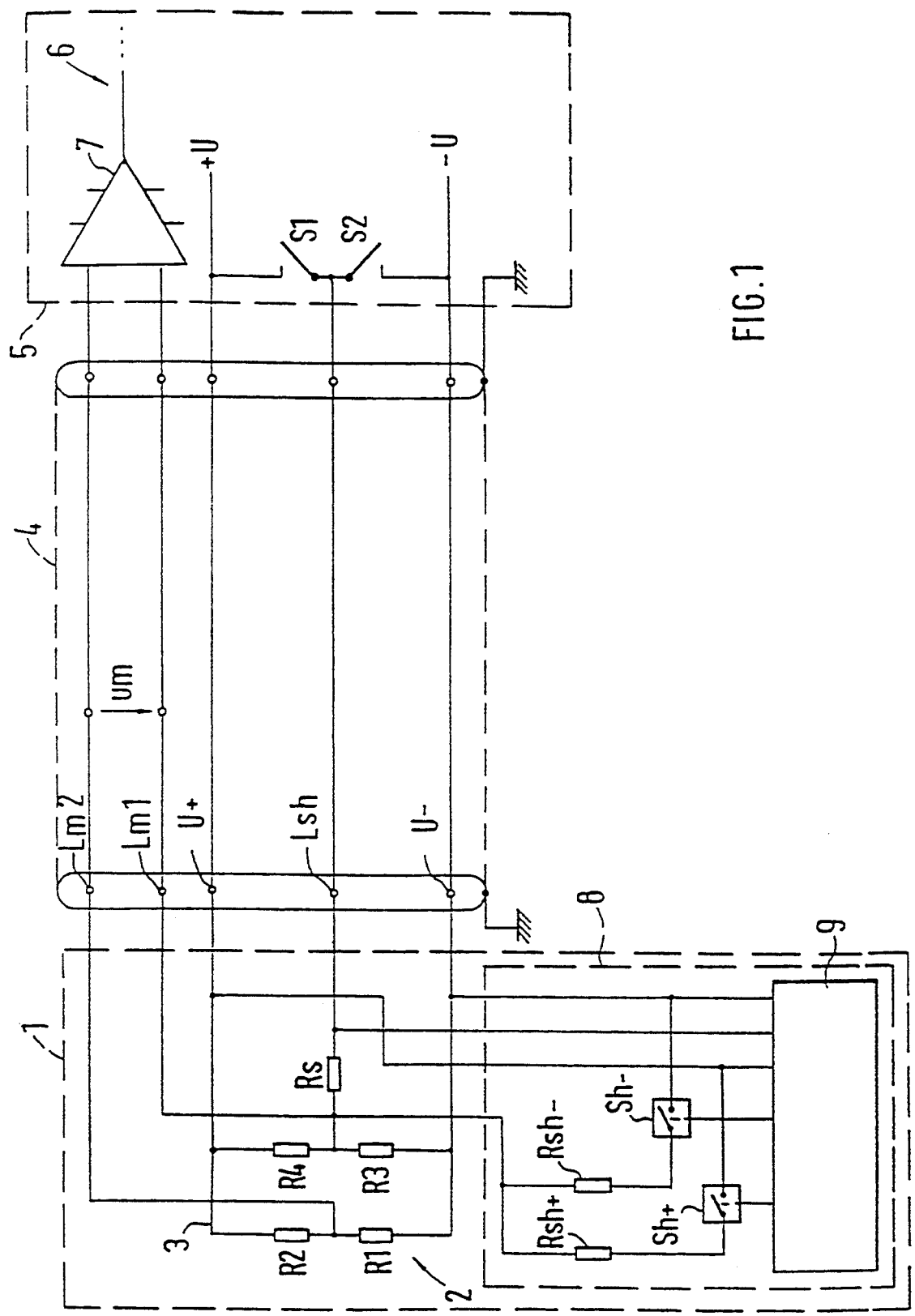
FIG. 1 is a block diagram of a measuring sensor device with a shunt calibration device, an identification generator and a pertaining analysis circuit constructed in accordance with an embodiment of the present invention.

In FIG. 1, a measuring sensor device for detecting a physical quantity has reference number 1. The measuring sensor device 1 comprises a physical-electrical transducer 2, such as a resistance sensor 3 which is connected to form a full bridge and has the (variable) bridge resistances R1, R2, R3 and R4. This may, for example, be a known wire strain gauge generator for the detection of tensile stress, pressure (diaphragm pressure transducer), force (load cell), acceleration (acceleration sensor), etc.

The resistance sensor 3 is connected via a connecting cable with the lines U+, U− for the feeding of a first bridge diagonal (supply voltage +U, −U), in other words, for the energy supply of the measuring sensor device 1. The resistance sensor 1 is also connected via lines Lm1 and Lm2 for taking a measuring voltage (um) off a second bridge diagonal, with an analysis circuit 5, such as described, for example, in German Patent Document DE-37 43 846 A1.

In addition to a measuring chain 6 with a measuring amplifier 7 and a voltage supply +U, −U, the analysis circuit 5 comprises two switches (first shunt switch S1, second shunt switch S2) by means of which a shunt line Lsh leading to the measuring sensor device 1 can be connected with the energy supply lines U+, U− with the supply voltages +U and −U. These shunt switches S1 and S2 may be manually operable switches which are pressed by an operator when the measuring sensor device 1 is aligned. However, it is also conceivable that these shunt switches S1, S2 are electronically controlled or controllable switches which are automatically controlled by the analysis circuit 5 or a computer system connected behind it. The analysis circuit 5 will not be described here in detail because its construction may be largely arbitrary. Also, these types of analysis circuits may be purchased.

In the measuring sensor device 1, a shunt resistor Rs is connected between the shunt line Lsh and the bridge resistors R3, R4 or the measuring line Lm1. By the closing of the first shunt switch S1, the shunt resistor Rs is therefore connected in parallel to bridge resistor R4 so that the measuring bridge 3 is detuned in a defined manner. In the same manner, the shunt resistor Rs is placed in parallel to the bridge resistor R3 by the closing of the second shunt switch S2. As a result, a "shunt calibration" of the whole measuring system may be carried out in order to calibrate it (calibrating operation).

The measuring sensor device 1 is provided with an identification generator 8 which, among other things, comprises a memory module with an assigned control logic 9. Sensor identification data of the measuring sensor device 1 are stored in this memory module. These may be correction data for the compensation of static and/or dynamic transducing characteristics of the physical-electrical transducer 2, such as amplification and zero point errors, nonlinearities, etc. In addition, operating data for the measuring sensor device 1 or the physical-electrical transducer 2, such as the operating voltage as well as data concerning the site of application of the measuring sensor device 1, may be filed in this memory module.

For the configuration or parameterization of the analysis circuit 5, or the computer connected to it, the data that are digitally present in the identification generator 8 are rendered transmissible and available without any additional lines from the memory module to the analysis circuit 5. For this purpose, the identification generator 8 is equipped with at least one switching element (electrically controlled first auxiliary shunt switch Sh+) which is controlled by the control logic 9, by means of which an auxiliary shunt resistor Rsh+ can be switched in parallel to the bridge resistor R4. If necessary, a second auxiliary shunt switch Sh— can be provided in the same manner which switches a second auxiliary shunt resistor Rsh— in parallel to the bridge resistor R3.

With respect to the bridged parts or the parts to be bridged of the sensor 1 or the electrical-physical transducer, in the uncontrolled condition, the electrically controlled switches (auxiliary shunt switches Sh+, Sh—) are constructed as highly resistive and largely capacitance-free switching elements (preferably as transistors, field effect transistors or analog switches).

The identification generator 8 or its control logic 9 can now close or open at least one of these two auxiliary shunt switches Sh+, Sh— in the frequency of a data bit flow which is to be read out serially from the memory and contains the identification data. In this manner, the measuring bridge 2 is detuned in a defined manner when one of these switches Sh+, Sh— is closed. The binary digital data of the memory module are transformed into an information flow of defined (analog) electrical voltage pulses (on the measuring lines Lm1, Lm2). The analysis circuit 5, which follows, or a computer, which is connected behind, can digitally regenerate the identification data from the level fluctuations on the analog measuring lines Lm1 and Lm2. These identification data may then be used in the measuring operation for the correction of the data, which are furnished by the physical transducer, within the analysis circuit 5 or the computer connected behind it (operating voltage adjustment, adjusting of the amplification factor and of the zero point, etc.).

In this embodiment, the process of data transmission (identification operation) is initiated by the shunt line Lsh, for the purpose of which the shunt line Lsh is connected with the identification generator 8. For this purpose, the identification generator 8 is equipped with a circuit which responds to a special bit pattern flow on the shunt line Lsh by means of which the measuring operation mode, the calibrating operation mode and the identifying operation mode (for the transmission of the identification data) can be initiated or switched over.

By means of this multiple utilization of the shunt line Lsh, it is therefore possible to achieve the transmission of identification data from the identification generator 8 to the analysis circuit 5 (and vice versa) without any additional lines.

Figure 2:
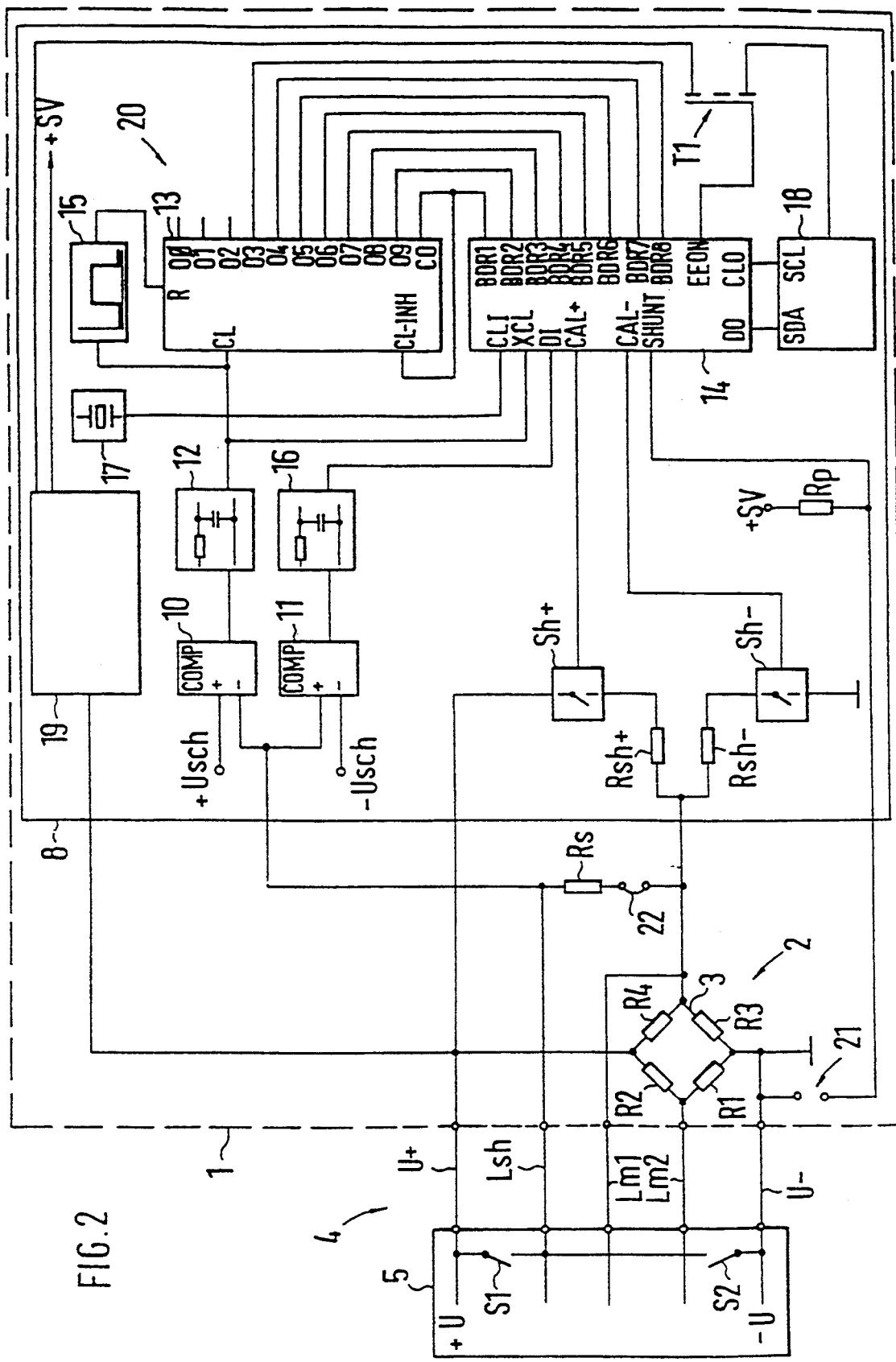
FIG. 2 is a block diagram according to FIG. 1 but shows the identification generator in greater detail.

FIG. 2 illustrates such an identification generator 8 in detail. The same components again have the same component symbols as in FIG. 1. A first comparator 10 compares the level on the shunt line Lsh with a positive switch-over threshold +Usch, whereby a closing of the first shunt switch S1 can be detected. A second comparator 11 compares the level on the shunt line Lsh with a negative switch-over level —Usch in order to detect a closing of the shunt switch S2. Pulses at the output of the first comparator 10 are fed, freed of interference pulses, via a first filter circuit 12, to a counting input CL of an operating mode counter 13 as well as to an input XCL of a control circuit 14. A first time function element 15 (time window discriminator) detects a longer pulse at the counting input of the operating mode counter 13 and resets it via a reset input R (transition into the measuring and calibrating operation).

The comparator 11 is also connected via a second filter circuit 16 used for the suppression of interference signals with an input DI of the control circuit 14. A timing generator 17 is used for providing a system timing for the control circuit 14 (input CLI). The control circuit 14 finally reacts to signals at the output of the first filter circuit 12 and the second filter circuit 16 as well as the counting outputs 00 to 09 and C0 of the operating mode counter 13. As a function of these signals, the control circuit 14 controls a serial electrically erasable and rewritable nonvolatile memory module (EEPROM) 18 as well as the auxiliary shunt switches Sh+, Sh—.

The identification generator 8 also comprises a power supply part 19 which is used for the power supply of all active parts of the identification generator 8. In this embodiment, the power supply part 19 may comprise a voltage doubler and/or a voltage stabilizing circuit. In the normal measuring operation, the control circuit 14 can disconnect components with a higher energy consumption by means of a field effect transistor T1 from the power supply 19 (for example, the memory module 18).

The operation of the whole arrangement is as follows: By way of the shunt switches S1 and S2 within the analysis circuit 5, the shunt line Lsh can be switched to positive operating voltage +U and negative operating voltage —U. The comparators 10 and 11 compare the signal level on the shunt line Lsh with the switch-over thresholds +Usch, —Usch. If there is an exceeding or falling below these switch-over thresholds, the comparators 10, 11 emit via the filters 12 and 16 signals to the controlling circuit 20. (The circuit 20 comprises the time function element 15, the operating mode counter 13 and the control circuit 14.) The controlling circuit 20 reacts to defined pulses or a defined pulse sequence on the shunt line Lsh. By the superimposing of such pulses or pulse sequences by means of the shunt switches S1, S2, the operating mode of the identification generator 8 can then be switched by the controlling circuit 20. The operating mode can be switched between measuring operation, calibrating operation.

In the measuring operation, the auxiliary shunt switches Sh+, Sh− are not controlled so that they are resistive and therefore leave the measured value sensing largely unaffected. Furthermore, components with a higher power consumption, such as the memory module 18, are disconnected from the power supply 19 by the uncontrolled field effect transistor T1.

In the calibrating operation, the physical-electrical transducer 2 (the measuring bridge 3) can be detuned in a defined manner by the shunt switches S1, S2 and the shunt resistor Rs by means of a continuous operation of the shunt switches S1, S2. By controlling the auxiliary shunt switches Sh+, Sh−, which switch the auxiliary shunt resistors Rsh+, Rsh− against the positive operating voltage +U or the negative operating voltage −U in the frequency of the data bit flow which is serially read out of the memory module 18, the controlling circuit can, in the identifying operation, transmit the identification data filed in the memory module 18 to the analysis circuit 5. There, or in the computer connected behind it, the correction data can be regenerated from the analog signals on the measuring lines Lm1, Lm2 or from the changes of these signals.

The activating of the transmission of the identification data or the initiating of the identifying operation takes place by superimposing a certain first number of pulses of a defined first pulse width on the shunt line Lsh by means of the first shunt switch S1. Via the first comparator 10 and the filter circuit 12 and a time function element within the operating mode counter 13 (time window discriminator, not shown), the width of the pulse generated by the first shunt switch S1 is examined. The operating mode counter 13 examines whether the width of the first pulse generated by the first shunt switch S1 is no wider than the first pulse width, the operating mode counter 13 is then counted upward.

When the operating mode counter 13, which is constructed as a decimal counter, reaches count 3, the initiating of the identification operation takes place. Subsequently, the control circuit 14 generates a timing signal at its output CLO which acts upon the timing input SCL of the serial memory module 18. By way of the input/output DO, a control signal and a starting address is emitted to the input/output SDA of the memory module 18, which then emits the corresponding data word via the input/output SDA to the input/output DO of the control circuit 14.

The control circuit 14 converts the data word by the emitting of a control pulse for the first auxiliary shunt switch Sh+ via the output CAL+ into an asynchronous data word. The control circuit 14 can also convert the data word by means of the controlling of both auxiliary shunt switches Sh+, Sh−, in each case via the outputs CAL+, CAL−, into an asynchronous three-level signal on the measuring lines LM1, LM2, in the case of which, by means of the second auxiliary shunt switch Sh−, a timing signal is superimposed on the data word generated by the first auxiliary shunt switch Sh+, or vice versa. Subsequently, by means of transmitting an acknowledge signal via the input/output DO, the next data word is requested from the memory cell of the memory module 18 which follows and is transmitted correspondingly to the analysis circuit 5. This operation will be repeated until the memory module 18 is read out or a corresponding data word in the memory module 18 indicates the end of the transmission (repetitive emission).

By means of the operating mode counter 13, it is possible, by superimposing additional pulses of a defined first pulse width on the shunt line by means of the shunt switch S1, to set either transmission parameters for the transmission of the identification data (first version) or to vary a starting address for the readout process from the memory module 18 (second version).

In the first version, by superimposing a second number of (up to five additional) pulses of the first pulse width, the data transmission speed (baud rate) for the data transmission to the analysis circuit 5 can be reduced in steps starting from 9,600 baud (4,800 baud, 2,400 baud, ... ). Thus, it becomes possible to adapt the data transmission to the time response of the analysis circuit 5 which follows. The reason is that, as a rule, low-pass filters are connected into the measuring chain with a certain limit frequency. It must therefore be ensured that these low-pass filters let the data bit flow from the measuring sensor device 2 or the identification generator 8 pass through.

In the second version, it is possible, by superimposing three pulses on the shunt line Lsh by means of the shunt switch S1, to initiate the identification operation and to read out the memory module 18 starting from the lowest starting address (for example, 0000). By superimposing a third number of (up to five additional) pulses of a first pulse width on the shunt line Lsh, this starting address may be increased in steps. As a result, it is possible to shorten the readout process when only data starting from a specific starting address are of interest.

By superimposing a certain fourth number (ten) pulses of a defined first pulse width on the shunt line Lsh by means of the first shunt switch S1, the identification generator 8 can be changed to a direct-access operating condition in which data can be read directly into certain memory location addresses or read out of arbitrary memory location addresses.

The reading-in and reading-out of data in the direct-access operating mode takes place by superimposing a three-level signal on the shunt line Lsh which is generated by means of the first and second shunt switches S1 and S2. However, for this purpose, it is necessary that the shunt switches S1 and S2 themselves are electrically controllable and can be controlled by a computer which may be integrated in the analysis circuit 5 or connected behind the analysis circuit 5 or by a programming device.

By means of the second shunt switch S2, the bit-serial input takes place of control commands, addresses and data for the readin of data into the memory module 18 takes place. For the readout of data, only control commands and addresses are generated by means of the second shunt switch S2. In both cases, a timing signal is synchronously superimposed by means of the first shunt switch S1 on the control, address and data words. The controlling circuit 20 or the control circuit 14 converts these three-level signals into corresponding control signals for the memory module 18. The readout of the correspondingly addressed memory cells takes place, as described above, by means of the auxiliary shunt switches Sh+, Sh− and auxiliary shunt resistors Rsh+, Rsh− via the measuring lines Lm1, Lm2 by way of three-level signals.

When the direct-access operating mode is initiated, the operating mode counter 13 is blocked the input CL-INH for further pulses of a defined first pulse width at the input CL.

The time function element 15 (time window discriminator) responds to the superimposing of a pulse of a defined second pulse width on the shunt line Lsh by means of the shunt switch S1. By the recognition of this pulse with a pulse width which is at least twice as large as the pulses of the defined first pulse width, the operating mode counter 13 or the controlling circuit 20 is reset and the measuring sensor device 3 changes over into the measuring operation.

By contrast, the calibration operation is initiated by a closing of the shunt switch S1 or S2 of a still longer duration so that this operating mode is virtually preceded by the resetting of the controlling circuit 20. The identification generator will then be inoperative, and via the shunt switches S1 and S2, the shunt resistor Rs is placed in parallel to the one bridge branch R2, R4 or to the other bridge branch R1, R3.

As a result of the hardwired logic (by means of wire bridges 21 and 22), a switch-over can take place from shunt calibration by the shunt switches S1 and S2 and the shunt resistor Rs to shunt calibration of auxiliary shunt switches Sh+, Sh− and the auxiliary shunt resistors Rsh+, Rsh−. For this purpose, the wire bridge 22 must be opened up and a wire bridge 21 must be introduced so that the shunt resistor Rs is disconnected from the measuring bridge, and the SHUNT input of the control module 14, which via a pull-up resistor Rp, is connected to positive operating voltage Sv of the power supply part 19, is pulled down to the −U potential. Via inputs XCL and DI, the control circuit 14 detects the actuating of the shunt switches S1 or S2 over a longer period of time which is above the second pulse width, and, as a function of it, controls the auxiliary shunt switches Sh+ and Sh−.

Figure 3:
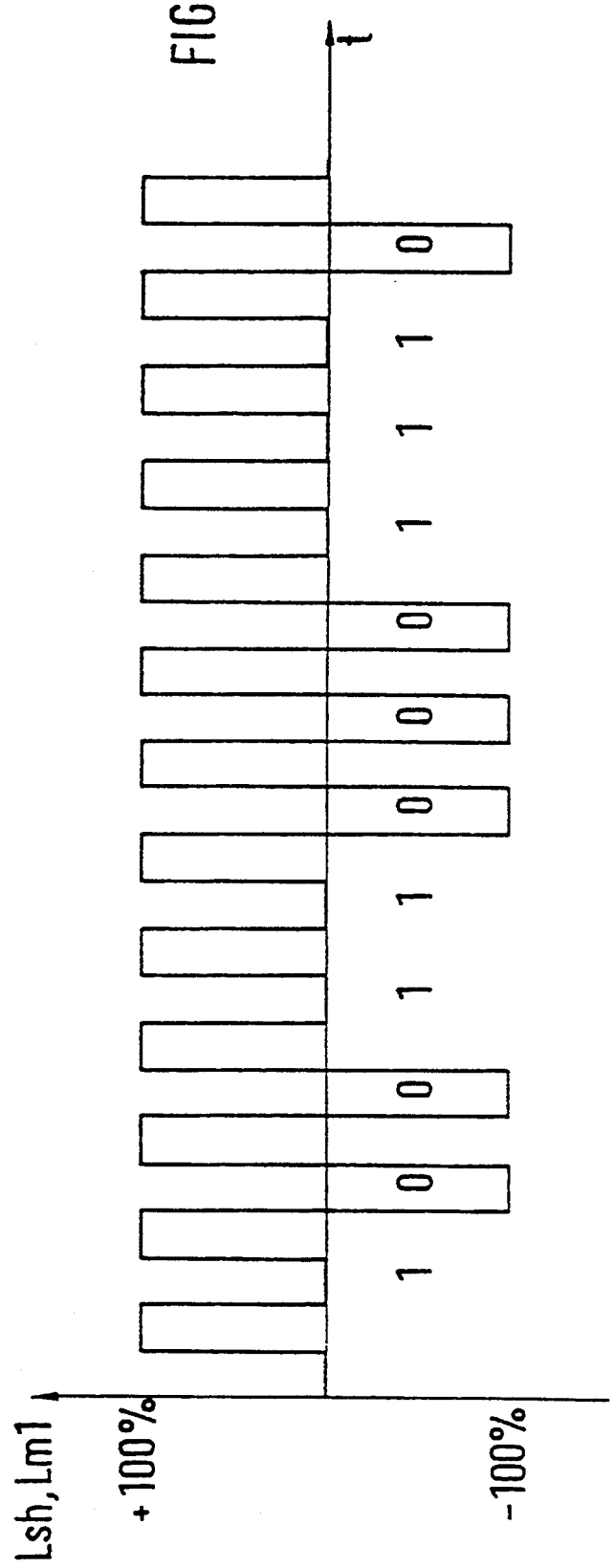
FIG. 3 is a view of a three-level signal for the transmission of control information, addresses and data on a shunt line or measuring line.

FIG. 3 shows an example of a three-level signal, as it is: 1) superimposed in the direct-access mode on the shunt line Lsh by means of the shunt switches S1 and S2; or 2) as it is generated as a voltage signal on the measuring lines Lm1, Lm2 in the case of the data transmission from the identification generator 8 to the analysis circuit 5 by controlling of the auxiliary shunt switches Sh+, Sh− by means of the control circuit. In the lower quadrant, the clock signal is illustrated, while the upper quadrant contains a serial datum of zeros and ones.

Figure 4:
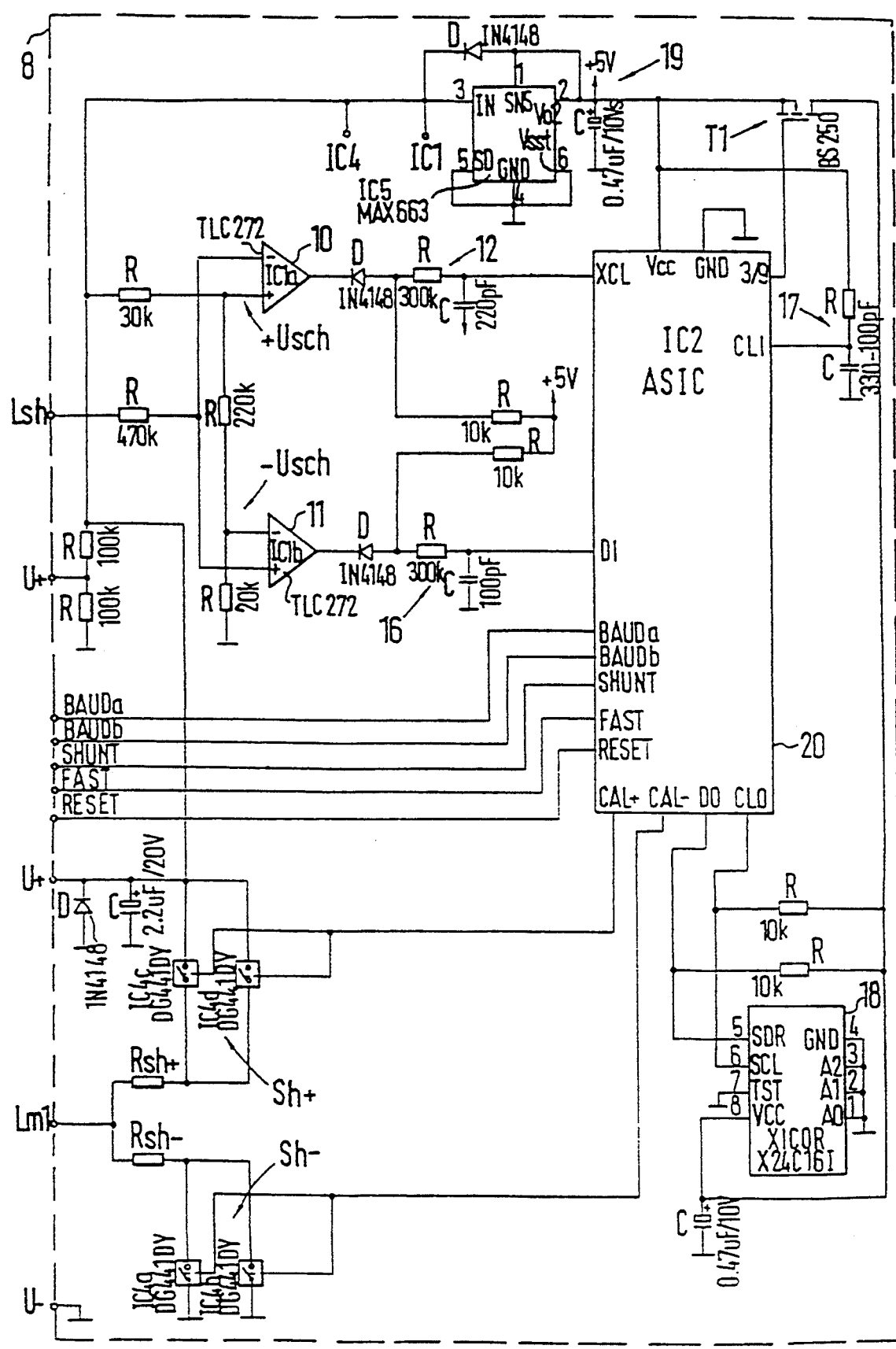
FIG. 4 is a wiring diagram of the identification generator according to FIG. 2.

FIG. 4 illustrates an implementation of the identification generator 8. In this case, the controlling circuit 20 combines the operating mode counter 13, the control module 14 and the time window discriminators (time function element 15). It is constructed as an ASIC (Application Specific Integrated Circuit) and carries out the same function as the controlling circuit 20. An integrated circuit of XICOR Co. of the X24C161 specification is selected as the electrically erasable and programmable nonvolatile memory module with a serial input/output (serial EEPROM).

In the following, the functions of the ASIC 20 will again be summarized: The module contains all of the digital logic for the switching-on of the operating modes, the sequence control for the repetitive emission of all data from the memory module 18 starting from a set address, and the direct-access operating mode. The control signals for the initiating and modifying of the different operating modes and for the reading and writing of the memory module 18 in the direct-access operating mode are detected via the lines DI and XCL. The output signals, represent a mixed signal (three-level signal) comprising timing, data, and control, via outputs CAL+ and CAL−, and the auxiliary shunt switches Sh+ and Sh−. In the illustrated embodiment, the first pulse width amounts to optionally 50 msec or 3.2 msec, in which case the corresponding switch-over may take place by means of hardwired logic (wire bridge from the FAST input against mass).

In the identification operation (count 3 to 8), the sequence control for the repetitive output of the data from the memory module 18 is operative, in which case, as a function of the count, data are sent starting from certain block addresses. The sequence control has the task of furnishing in the EEPROM 18 a timing signal by way of the connection CLO, SCL and a starting address and a reading command corresponding to the EEPROM specification by way of the DO-SDA connection. After the first data word to be sent by the EEPROM 18, the controlling circuit generates, in a timing-synchronous manner, after the eighth bit, an acknowledge signal which causes the EEPROM to increase its internal address counter and to emit with the following timing pulses the next data word, etc. This continuous data output will be stopped by a positive pulse on the shunt line Lsh which is more than twice as long than the pulse of the first pulse width which is used for the switching-on and relaying.

In the direct-access operating mode (count 9), the EEPROM 18 is accessed through the inputs DI and XCL. In this case, the sequence control for the repetitive operation is rendered inoperative. Information read in via the shunt line Lsh is transformed such that a signal image is created which corresponds to the specifications of the EEPROM 18. In this manner, it is possible to access each memory cell directly from the analysis circuit 5 (in the case of the corresponding hardware and software).

Finally, in addition to the FAST input for the switching-over of the control pulse scanning and the SHUNT input for the switching-over of the external shunt calibration to the internal shunt calibration, the controlling circuit 20 has another additional input for the resetting of the controlling circuit and two inputs BAUDa and BAUDb by means of which, as a result of a hardwired logic (switching against the negative potential −U), the output speed of the data can be adjusted in four steps.

Figure 5:
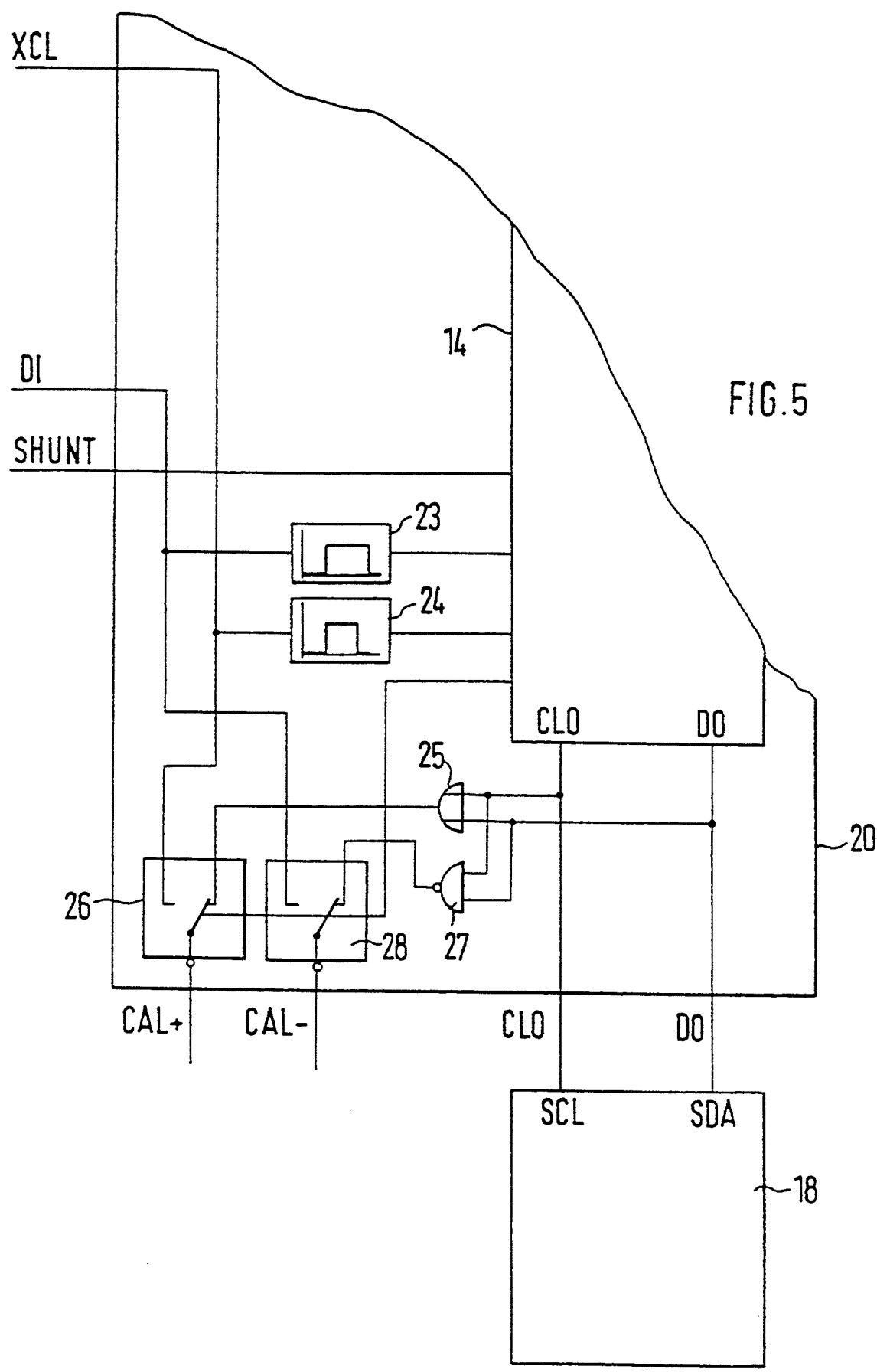
FIG. 5 is a wiring diagram of a part of a controlling circuit of the identification generator.

FIG. 5 illustrates a special development of the controlling circuit 20. It was found to be useful to slightly vary with respect to time the flanks of the data proportion and of the timing proportion of the three-level signals on the shunt line and the measuring lines. As a result, in particular, possible short circuits in the system are avoided and the retrieving of the data and timing signals from the three-level signal is simplified.

For this purpose, a second time function element 23 (time window discriminator) is connected between the input DI of the controlling circuit 20 and the control circuit 14, and a third time function element 24 is connected between input XCL of the controlling circuit 20 and the control circuit 14. These two time window discriminators 23 and 24 examine whether the arriving data signals are in a larger time window and the arriving timing signals are in a smaller time window. Inside the control circuit 14, the dividing takes place of the three-level signal on the shunt line Lsh into the data and timing signals for the transmission via the output C10 to the input SCL of the EEPROM 18 and by way of the input/output DO of the controlling circuit to the input-/output of the EEPROM 18.

Via an OR-gate 25, which, with its inputs, is placed on connections DO-SDA and CLO-SCL between the control circuit 14 and the memory module 18, the data exchanged between the two modules are linked with one another and are emitted, by way of a first inverting controllable switch 26, to the output CAL+. In the same manner, a negating AND-gate 27 links data exchanged between the control circuit and the memory module and emits them to the output CAL− via a second inverting controllable switch 28. By means of the auxiliary shunt switches Sh+, Sh− controlled by means of the outputs CAL+, CAL−, the three-level signal is in turn generated on the measuring lines Lm1, Lm2.

The first controllable switch 26 and the second controllable switch 28 may finally in the measuring operation and the calibration operation, by means of the auxiliary shunt switches Sh+, Sh− and the auxiliary shunt resistors Rsh+, Rsh− (input SHUNT active) disconnect the outputs CAL+, CAL− from the gates 25 and 27 and switch them directly to the inputs XCL and DI. On the one hand, this ensures an undisturbed measuring operation and, on the other hand, in the calibration operation, the auxiliary shunt switches Sh+, Sh− can be controlled directly by means of the shunt switches S1, S2. It should finally be noted that, in the identifying operation, the above-mentioned circuit permits a "listening-in" with respect to the signals sent to the identification generator 8 via the gates 25, 27.

Because of the required specific adaptation of the module 20 to be controlled to the specific requirements concerning the data format and the control commands of the specific memory module that is used, further details of the internal construction of the controlling module 20, which is implemented as the ASIC, are not further discussed here. These specifications can be found in the respective data sheet of the actually used serial EEPROM and the ASIC can be developed correspondingly by one of ordinary skill in the art.

FIG. 6 shows the signal and data forms on lines DO-SDA and CLO-SCL between the controlling circuit 20 and the memory module 18 as well as the signals to be generated by the shunt switches S1 and S2 and the signals on the shunt line Lsh and the measuring lines Lm1, Lm2. The signals have the same relationship to one another with respect to time.

The signal form according to FIG. 6a corresponds to the specification of the memory module of XICOR Co. of the type X24C161 and shows the data exchange between the controlling circuit 20 and the memory module 18 during the reading of data. The signals which are generated by the controlling circuit 26 on the connection DO-SDA, in this case, are illustrated above the signal flow (DO->SDA), while the signals generated by the memory module are illustrated below the signal flow (DO<-SDA). After the sending of a starting signal (start bits) by the controlling circuit 20 and a block address (slave address), the memory module 18 responds with an acknowledge signal (ACK). Then the controlling circuit 20 sends a data word address (word address) or several word addresses which are each acknowledged by an acknowledge signal from the memory module 18. Upon another sending of a start bit and of the block address by the controlling circuit 20, the memory circuit 18 again responds by an acknowledge signal, followed by one data word respectively, from the requested address. The controlling circuit 20 acknowledges each arriving data word with an acknowledge signal and, when all data words are read out, sends a stop signal (stop bit) by means of which the data transmission between the two modules is terminated.

FIG. 6b shows a signal image which is to be generated for achieving the signal image according to FIG. 6a by means of the second shunt switch S2.

FIG. 6c shows the signal image to be generated by means of the first shunt switch S1 which, in the same manner, is created on the connection between the inputs CLO and SCL of the modules 18 and 20. When examined more closely, it is determined that the pulses of the timing signal, except in the case of the start bit, are always situated within the pulses of the data signal. Only in the case of the start bit, the trailing edge of the data signal coincides with a (positive) pulse of the timing signal.

FIG. 6d finally shows the signal image generated by the actuating of the shunt switches S2 and S1 on the shunt line Lsh, while FIG. 6e shows the signal image on the measuring lines Lm1, Lm2.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. An arrangement comprising:
   a measuring sensor device for detecting a physical quantity with a physical electrical transducer that converts the physical quantity into an equivalent analog electrical quantity, the physical-electrical transducer being connected in a bridge circuit with branches;
   an analysis circuit connected to the measuring sensor device, the analysis circuit being constructionally separate from the measuring sensor device and converting the analog electrical quantity into digital data;
   electrical lines capable of transmitting measured values and supplying energy to the measuring sensor device;
   a shunt resistor on the measuring sensor device, shunt switches connected to the analysis circuit, and a shunt line connecting the shunt switches with the shunt resistor (shunt calibration, calibrating operation), the individual branches of the measuring bridge, for calibration purposes, being capable of being detuned in a defined manner by the shunt resistor, the shunt switches and the shunt line;
   an identification generator integrated in the measuring sensor device and having a nonvolatile memory module with correction data (sensor identification data) of the measuring sensor device, a controllable switching element situated in parallel to one of the branches of the measuring bridge, for the defined detuning of the measuring bridge in the controlled condition;
   the identification generator including at least one auxiliary shunt resistor and at least one electrically controllable auxiliary shunt switch the auxiliary shunt resistor being connectable in parallel by the auxiliary shunt switch to the shunt switches and the shunt resistor;
   the identification generator further including a controlling circuit which responds to defined pulses on the shunt line and controls the identification generator, such that the identification generator has operating modes (measuring operation, calibrating operation) that are switchable in response to superimposition of said pulses on the shunt line by means of the shunt switches, the operating modes including:

measuring operation and calibrating operation, the identification generator being switched such that measuring sensing is substantially unaffected by the identification generator, calibrating operation, the physical-electrical transducer being detuned in a defined manner by the shunt switches and the shunt resistor, identifying operation, by controlling the auxiliary shunt switches via the controlling circuit, with correction data being transmitted via the measuring lines from the identification generator to the analysis circuit.

2. A measuring sensor device according to claim 1, wherein the controlling circuit has at least one counting circuit which detects at least one of the pulse length, the pulse number of the pulses and a pulse sequence on the shunt line and, switches the operating mode as a function thereof and, in the operating mode identifying operation, initializes and controls the transmission of correction data.

3. A measuring sensor device according to claim 2, wherein the controlling circuit of the identification generator includes means for controlling and addressing the memory module, and means for editing and converting control commands, data and addresses from and to the memory module.

4. A measuring sensor device according to claim 2, wherein control information, addresses and data are transmittable from the analysis circuit to the identification generator for the readin of sensor identification data via the shunt line.

5. A measuring sensor device according claim 1, wherein the first shunt switch activates the transmission of the identification data to the analysis circuit (initiating of the identifying operation, initializing of the identification generator) by superimposing a certain first number of pulses of a defined first pulse width on the shunt line.

6. A measuring sensor device according to claim 5, wherein the transmission parameters for the transmission of the identification data are determined by superimposing a certain second number of pulses of a defined first pulse width on the shunt line by means of the first shunt switch.

7. A measuring sensor device according to claim 5, wherein a starting address of the identification data for their transmission is determined by superimposing a certain third number of pulses of a defined first pulse width on the shunt line by means of the first shunt switch.

8. A measuring sensor device according to claim 1, by superimposing a certain fourth number of pulses of a defined first pulse width on the shunt line via the first shunt switch, the identification generator is changed to a direct-access operating state in which data are readable in directly on certain memory location addresses of the memory module via the shunt line and are readable out from arbitrary memory location addresses of the memory module via the measuring lines.

9. A measuring sensor device according to claim 8, wherein readin/readout of data in the direct-access operating state is caused by superimposing a three-level signal on the shunt line, the three-level signal being generated by the first and second shunt switch, the controlling circuit of the identification generator converting the three-level signal into corresponding control signals for the identification generator, a bit-serial input of control commands, addresses and data (readin) / control, commands and addresses (readout) taking place via the second shunt switch, and a timing signal generated by means of the first shunt switch being synchronously superimposed on the control address and data signals.

10. A measuring sensor device according to claim 9, wherein the generating of the three-level signal takes place in such a manner that edges of the timing signal are shifted with respect to time to edges of the control, address or data signal.

11. A measuring sensor device according to claim 1, wherein the superimposing of a pulse of a defined second pulse width on the shunt line via the first shunt switch causes a termination of the transmission of the identification data or an activating of the shunt calibration.

12. A measuring sensor device according to claim 1, wherein the transmission of identification data from the identification generator to the analysis circuit takes place in an asynchronous data format, and wherein the controlling circuit of the identification generator, via one of the second and first auxiliary shunt switches outputs the bit-serial output of the data and synchronously superimposes a timing signal on the data signal by means of the one of the first and second auxiliary shunt switches.

13. A measuring sensor device according to claim 11, wherein the transmission of the identification data from the identification generator to the analysis circuit is performed via the measuring lines in an asynchronous data format by means of a three-level signal, for the generating of which the inverted signal of an OR-gate acted upon by the control, address or data flows and timing signal flows between the memory module and the controlling circuit controls the first auxiliary shunt switch, the inverted signal of a NOT-AND gate, which is acted upon by the same signal flows, controls the second auxiliary shunt switch.

14. A measuring sensor device according to claim 1, wherein localizing and switching of transmission parameters takes place via one of a hardwired logic and coding switches.

15. A measuring sensor device according to claim 1, wherein the measuring sensor device is switched by one of hardwired logic or coding switches from a shunt calibration via the shunt switches and the shunt resistor to the shunt calibration via the auxiliary shunt switches and the auxiliary shunt resistors.

16. A measuring sensor device according to claim 1, wherein one of the first and second pulse width of the pulses to be superimposed on the shunt line can be changed by one of hardwired logic and coding switches.

17. A measuring sensor device according to claim 1, wherein the sensor identification data, in addition to the correction data for the compensation of static and dynamic transducing characteristics of the measuring sensor device and parts of the analysis circuit, comprise additional operating data for the measuring sensor device or for the physical-electrical transducer, as well as data concerning the application site of the measuring sensor device.

18. A measuring sensor device according to claim 1, wherein the identification generator has a plurality of modules, and wherein the modules of the identification generator with a lower energy consumption are connected directly and modules with a higher energy consumption are connected via a stand-by circuit to an energy supply of the physical-electrical transducer.

19. A measuring sensor device according to claim 1, wherein the electrically controlled switches with respect to the parts of the sensor and of the physical-electrical transducer that are bridgeable are switching elements that are highly resistive and substantially capacitance-free in an uncontrolled state.

20. A measuring sensor device according to claim 19, wherein the switching elements are transistors.

21. A measuring sensor device according to claim 20, wherein the switching elements are field effect transistors.

22. A measuring sensor device according to claim 19, wherein the switching elements are analog switches.

23. A measuring sensor device according claim 1, wherein the memory module is an erasable and programmable nonvolatile memory module with a serial input/output.

24. The arrangement of claim 1, wherein the identification generator, in response to an activatable transmission of the correction data to the analysis circuit, switches the controllable switching element on and off in a frequency of the data bit flow read out serially from the memory module and the analysis circuit detecting the analog signals at the measuring bridge and regenerating the correction data from the analog signals, the correction data being useable for correction of the electrical quantities furnished by the physical-electrical transducer.

* * * * *